United States Patent
Kim

(10) Patent No.: US 7,524,395 B2
(45) Date of Patent: Apr. 28, 2009

(54) PLASMA CHAMBER HAVING PLASMA SOURCE COIL AND METHOD FOR ETCHING THE WAFER USING THE SAME

(75) Inventor: Nam Hun Kim, Suwon-si (KR)

(73) Assignee: Adaptive Plasma Technology Corp., Icheon-si (KR)

( * ) Notice: Subject to any disclaimer, the term of this patent is extended or adjusted under 35 U.S.C. 154(b) by 83 days.

(21) Appl. No.: 10/593,857

(22) PCT Filed: Mar. 24, 2005

(86) PCT No.: PCT/KR2005/000860

§ 371 (c)(1),
(2), (4) Date: Sep. 22, 2006

(87) PCT Pub. No.: WO2006/004259

PCT Pub. Date: Jan. 12, 2006

(65) Prior Publication Data

US 2007/0221622 A1    Sep. 27, 2007

(30) Foreign Application Priority Data

Mar. 25, 2004    (KR) .................... 10-2004-0020321

(51) Int. Cl.
*C23F 1/00*    (2006.01)
*H01L 21/306*    (2006.01)
(52) U.S. Cl. .................. 156/345.1; 156/345.35; 156/345.36; 156/345.43; 156/345.48
(58) Field of Classification Search .......... 156/345.1, 156/345.35, 345.36, 345.43, 345.48
See application file for complete search history.

(56) References Cited

U.S. PATENT DOCUMENTS 5,690,781 A    11/1997    Yoshida et al.

(Continued)

FOREIGN PATENT DOCUMENTS

JP    8-88190    4/1996

(Continued)

OTHER PUBLICATIONS

International Search Report, dated Jul. 11, 2005, corresponding to PCT/KR2005/000860.

(Continued)

*Primary Examiner*—Duy-Vu N Deo
(74) *Attorney, Agent, or Firm*—Christie, Parker & Hale, LLP

(57) ABSTRACT

A plasma chamber having a plasma source coil includes a chamber body, a plasma source coil, and an edge bushing. The chamber body includes a reaction space, which is limited by a sidewall, a lower exterior wall, and an upper dome, and forms plasma. The plasma source coil arranged on the dome includes M unit coils corresponding to an integer greater than "2". The M unit coils having a predetermined rpm value "n" indicative of a positive integer are extended from a center bushing having a predetermined radius at a center part, and are spirally arranged along a circumference of the center bushing, such that the plasma is formed in the reaction space. The edge bushing arranged between the dome of the chamber body and the plasma source coil, and is configured in the form of a cylindrical shape to overlap with an edge of the wafer arranged in the reaction space.

4 Claims, 6 Drawing Sheets

U.S. PATENT DOCUMENTS

| | | | |
|---|---|---|---|
| 5,944,902 A * | 8/1999 | Redeker et al. | 118/723 AN |
| 6,447,636 B1 * | 9/2002 | Qian et al. | 156/345.48 |
| 6,475,335 B1 * | 11/2002 | Yin et al. | 156/345.48 |
| 6,534,007 B1 | 3/2003 | Blonigan et al. | |

FOREIGN PATENT DOCUMENTS

| | | |
|---|---|---|
| JP | 2002-110642 | 4/2002 |
| JP | 2003-24773 | 1/2003 |
| KR | 20-0177585 | 4/2000 |
| KR | 10-2002-0054479 | 7/2006 |
| WO | WO 99/06610 | 2/1999 |

OTHER PUBLICATIONS

Patent Abstracts of Japan, Publication 08-088190, Published Apr. 2, 1996, in the name of Yoshida et al.

Patent Abstracts of Japan, Publication 2002-110642, Published Apr. 12, 2002, in the name of Yasuda.

Patent Abstracts of Japan, Publication 2003-024773, Published Jan. 28, 2003, in the name of Takagi et al.

Korean Patent Abstracts, Publication 1020020054479 A, Published Jul. 8, 2002, in the name of Lee et al.

* cited by examiner edge    center part    edge edge    center part    edge

PLASMA CHAMBER HAVING PLASMA SOURCE COIL AND METHOD FOR ETCHING THE WAFER USING THE SAME

CROSS-REFERENCE TO RELATED APPLICATION

This application is a National Phase Patent Application of International Application Number PCT/KR2005/000860, filed on Mar. 24, 2005, which claims priority of Korean Patent Application Number 10-2004-0020321, filed Mar. 25, 2004.

TECHNICAL FIELD

The present invention relates to an apparatus and method for manufacturing a semi-conductor device, and more particularly to a plasma chamber including a plasma source coil for etching a semiconductor wafer using plasma and a method for etching a wafer using the plasma chamber.

BACKGROUND ART

In the last 20 years, techniques for manufacturing Ultra-Large Scale Integrate (ULSI) circuit components have been rapidly developed. The reason why the ULSI circuit components have been rapidly developed is that a variety of semiconductor fabrication devices capable of supporting fabrication techniques requiring the ultimate techniques have already been developed. Plasma chambers from among the above-mentioned semiconductor fabrication devices have been used not only for general etching processes but also for deposition processes, such that their range of applications has rapidly increased.

A plasma chamber is indicative of semiconductor fabrication equipment, which can artificially form plasma in a reaction space, and can perform a variety of processes such as etching and deposition using the formed plasma. The above-mentioned plasma chamber can be classified into Electron Cyclotron Resonance (ECR) sources, Helicon-Wave Excited Plasma (HWEP) sources, Capacitively Coupled Plasma (CCP) sources, and Inductively Coupled Plasma (ICP) sources, etc. Recently, there have been newly proposed Adaptively Plasma Sources (APS) indicative of not only ICP-source characteristics but also CCP-source characteristics at the same time.

When performing an etching process of a semiconductor wafer using the above-mentioned plasma chamber including the above-mentioned plasma sources, a Critical Dimension (CD) occurs in different ways at the center and an edge of the semi-conductor wafer. In this case, the CD is indicative of a difference between a desired etching profile before performing the etching process and an actual etching profile after performing the etching process. The CD occurs in a first case in which less etching is performed, and also occurs in a second case in which over etching is performed. In this way, the different CDs occur at the center and the edge of the semi-conductor wafer, resulting in deterioration of uniformity. The different CDs occur at the center and the edge of the semiconductor wafer due to a variety of reasons, for example, the occurrence of a polymer acting as a by-product generated by an etching process. Typically, a pumping speed of the polymer acting as the by-product is differently generated at the center and the edge of the semiconductor wafer. In more detail, a polymer generated at the edge of the semiconductor wafer has a short moving distance until being pumped, whereas a polymer generated at the center part of the semi-conductor wafer has a long moving distance until being pumped. Therefore, over etching occurs at the edge of the semiconductor wafer as compared to the degree of etching at the center part of the semiconductor wafer, such that an etching profile more excessively etched than a desired etching profile occurs. The above-mentioned problem may be encountered in various ways according to whether etching gas capable of generating a relatively large amount of polymer is used or the other etching gas capable of generating a relatively small amount of polymer is used.

DISCLOSURE OF INVENTION

Technical Problem

Therefore, the present invention has been made in view of the above problems, and it is an object of the present invention to provide a plasma chamber including a plasma source coil such that a uniform Critical Dimension (CD) is generated at the center and the edge of the semiconductor wafer.

It is another object of the present invention to provide a method for etching a wafer using a plasma chamber including a plasma source coil, such that it allows a CD to be uniformly generated at the center and the edge of a semiconductor wafer according to etching gas capable of generating different amounts of polymers acting as by-products.

TECHNICAL SOLUTION

In accordance with one aspect of the present invention, the above and other objects can be accomplished by the provision of a plasma chamber comprising: a chamber body for defining a reaction space capable of forming plasma by a sidewall, a lower exterior wall, and an upper dome; a plasma source coil arranged on the dome, for including unit coils arranged to have a predetermined turning number "n" calculated using a predetermined value of n=a×(b/m) (where "a" and "b" are both positive integers, and "m" is indicative of the number of unit coils corresponding to an integer greater than "2"), allowing the unit coils to be extended from a center bushing which has a predetermined radius at a center part, and allowing the unit coils to be spirally arranged along a circumference of the center bushing, such that the plasma is formed in the reaction space; and a cylindrical-shaped edge bushing which is arranged between the dome of the chamber body and the plasma source coil, and overlaps with an edge of the wafer disposed in the reaction space.

The edge bushing is formed of a ceramic or polymer-based material.

In accordance with another aspect of the present invention, there is provided a plasma chamber comprising: a chamber body for defining a reaction space capable of forming plasma by a sidewall, a lower exterior wall, and an upper dome; and a plasma source coil arranged on the dome, including a plurality of unit coils having a plurality of turning numbers, wherein the plurality of unit coils are extended from a center busing having a predetermined radius, are spirally wound along a circumference of the center bushing, and a distance between a wafer edge and the dome is relatively longer than a distance between a wafer center and the dome.

The unit coils are arranged to have a predetermined turning number "n" calculated using a predetermined value of n=a× (b/m) (where "a" and "b" are both positive integers, and "m" is indicative of the number of unit coils corresponding to an integer greater than "2").

In accordance with yet another aspect of the present invention, there is provided a plasma chamber comprising: a chamber body for limiting a size of a reaction space capable of forming plasma by a sidewall, a lower exterior wall, and an upper dome; and a plasma source coil arranged on the dome, for allowing a plurality of unit coils having a plurality of turning numbers to be extended from a center bushing which has a predetermined radius at a center part, and allowing the unit coils to be spirally arranged along the circumference of the center bushing, in which, as the unit coils are arranged in a direction from a center part of a wafer to an edge of the wafer, a distance from the dome is gradually increased such that the unit coils are arranged stepwise and the plasma is formed in the reaction space.

The unit coils are arranged to have a predetermined turning number "n" calculated using a predetermined value of n=a×(b/m) (where "a" and "b" are both positive integers, and "m" is indicative of the number of unit coils corresponding to an integer greater than "2".

In accordance with yet another aspect of the present invention, there is provided a method for etching a wafer comprising the steps of: a) preparing not only a first plasma source coil in which a plasma density at an edge of the wafer is less than the other plasma density at a center part of the wafer, but also a second plasma source coil in which the plasma density at the edge of the wafer is higher than the other plasma density at the center part of the wafer; b) determining whether an F/C (Fluorine/Carbon) ratio of the etching gas is high or low; c) if the F/C ratio is high, performing an etching process using the first plasma source coil; and d) if the F/C ratio is low, performing an etching process using the second plasma source coil.

The first plasma source coil has a structure of a concave-type wherein the first plasma source coil is more concave in the center part than in the edge of the wafer in the direction of a chamber body.

The second plasma source coil has a structure of a convex-type wherein the second plasma source coil is more convex in the center part than in the edge of the wafer in the direction opposite to a chamber body.

The step b) includes the steps of: if the F/C ratio of the etching gas is higher than "2" determining that the etching gas has a high F/C ratio; and if the F/C ratio of the etching gas is equal to or less than "2", determining that the etching gas has a low F/C ratio.

The etching gas having the F/C ratio greater than "2" generates less polymers acting as by-products as compared to the other etching gas having an F/C ratio less than or equal to "2".

The etching gas having the F/C ratio greater than "2" is indicative of an etching gas including at least one of $CF_4$, $C_2F_6$, $C_3F_8$, and $CHF_3$. The other etching gas having the F/C ratio of the same or less than "2" is indicative of an etching gas including at least one of $C_4F_8$, $C_5F_8$, $CH_3F$, $CH_2F_2$, and $C_4F_6$.

ADVANTAGEOUS EFFECTS

A plasma chamber including a plasma source coil according to the present invention allows the density of plasma generated at the edge of a semiconductor wafer to be higher than the other density of plasma generated at the center part of the semi-conductor wafer. Therefore, the plasma chamber can prevent a CD value measured at the edge of the semiconductor wafer from being increased than that measured at the center part of the semiconductor wafer. A wafer etching method of the present invention uses a concave- or convex-shaped plasma source coil according to the quantity of polymers generated by a used etching gas, resulting in reduction of a CD at the edge of the semiconductor wafer.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
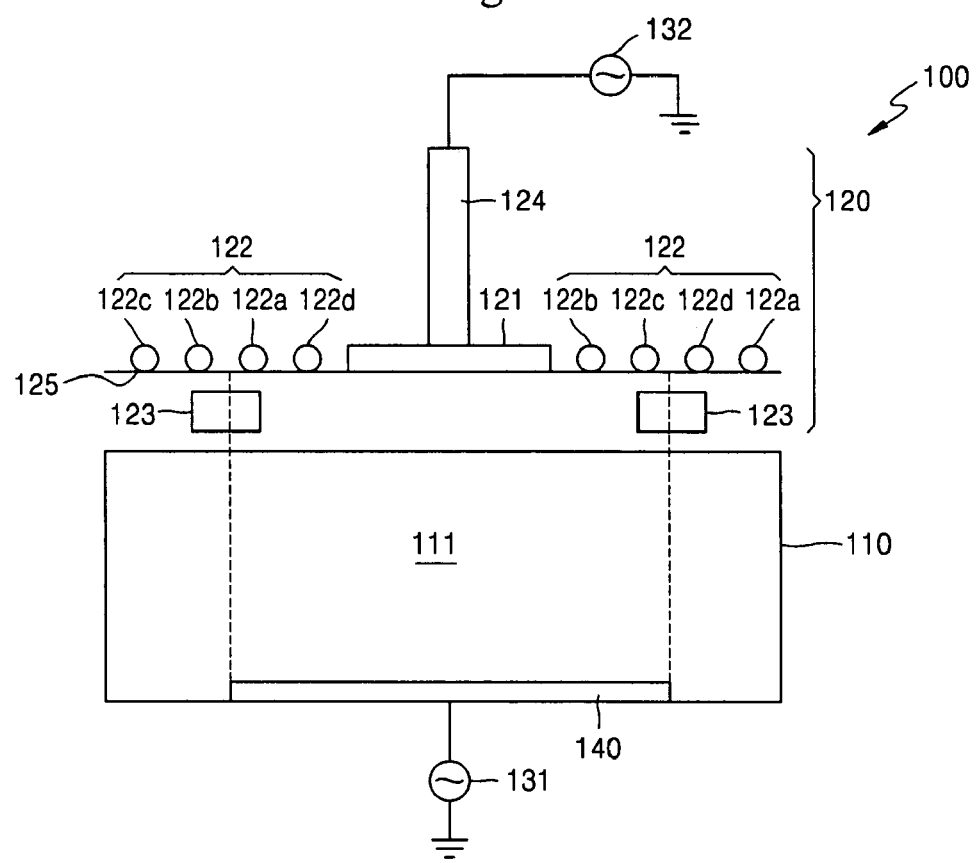
FIG. 1 is a cross-sectional view illustrating a plasma chamber including a plasma source coil in accordance with a preferred embodiment of the present invention.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 2:
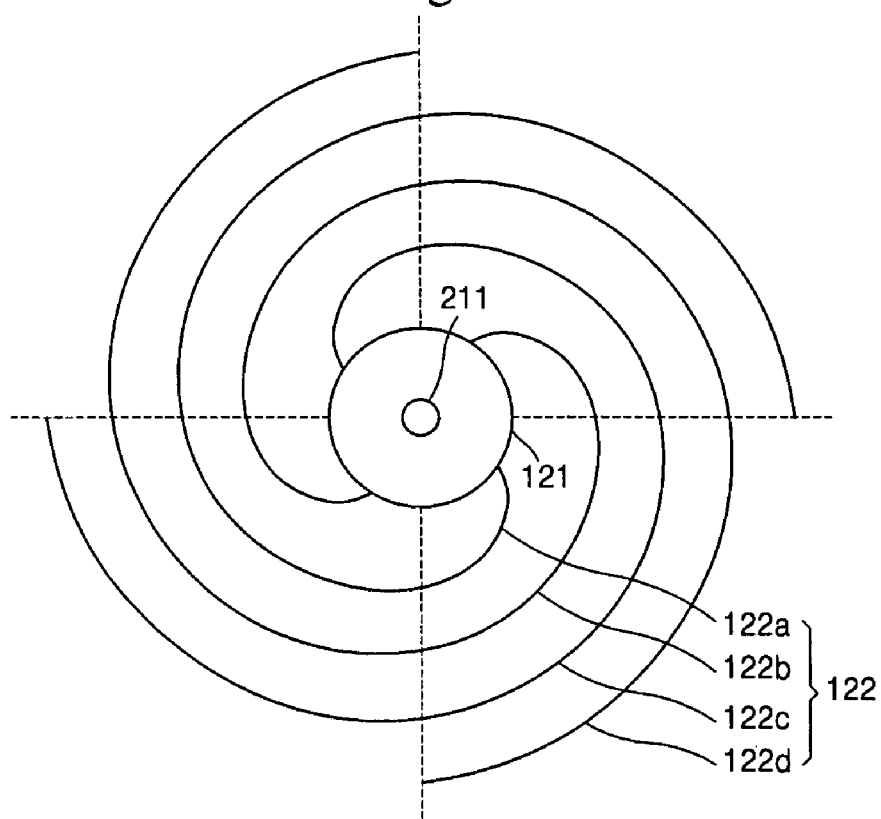
FIG. 2 shows the appearance of a center bushing and a plasma source coil shown in FIG. 1.
Figure 3:
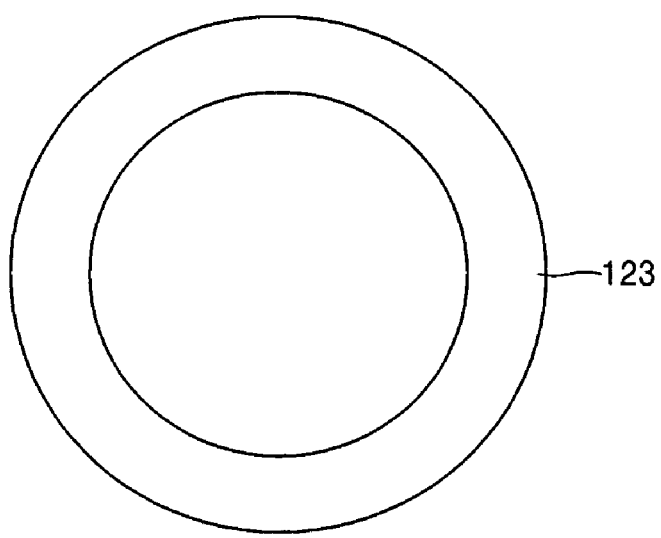
FIG. 3 is a plan view illustrating a bushing placed at the edge (hereinafter referred to as an edge bushing) shown in FIG. 1.

FIG. 1 is a cross-sectional view illustrating a plasma chamber including a plasma source coil in accordance with a preferred embodiment of the present invention. FIG. 2 shows the appearance of a center bushing and a plasma source coil shown in FIG. 1. FIG. 3 is a plan view illustrating an edge bushing shown in FIG. 1.

Referring to FIG. 1, a plasma chamber 100 in accordance with a preferred embodiment of the present invention includes a chamber body 110 and a plasma source coil 120. The plasma chamber 100 further includes RF power-supply units 131 and 132.

The chamber body 110 includes a predetermined-sized internal space 111 limited by a sidewall, a lower exterior wall, and an upper dome. A wafer 140 to be processed is disposed at the bottom of the internal space 111. In order to dispose the wafer 140 at the bottom of the internal space 111, a susceptor (not shown) for supporting the wafer 140 is arranged at the bottom of the internal space 111. The susceptor is connected to one terminal of an external first RF power-supply unit 131 of the chamber body 110. The other terminal of the first RF power-supply unit 131 is grounded.

The plasma source coil 120 includes a center bushing 121, a plurality of unit coils 122, and edge bushings 123. The center bushing 121 and the unit coils 122 are supported by a support 125 so as to be spaced apart from an upper surface of the dome placed at an upper part of the chamber body 110 by a predetermined distance. The support 125 can take various forms. For example, the support 125 may be indicative of a dielectric layer arranged between the unit coils 122 and the dome. Also, the support 125 may be indicative of a fixed object spaced apart from the dome by a predetermined distance. In this case, empty space exists between the support 125 and the upper surface of the dome. The center bushing 121 is located at the center part. A support rod 124 projected in a predetermined direction perpendicular to the center surface of the center bushing 121 is arranged at the center part of the center bushing 121. The support rod 124 is connected to one terminal of the second RF power-supply unit 132. The other terminal of the second RF power-supply unit 132 is grounded. It is preferable that the support rod 124 is formed of the same material as the center bushing 121, but the support rod 124 can also be formed of other materials if needed.

The unit coils 122 are indicative of a plurality of unit coils 122a, 122b, 122c, and 122d, as shown in FIG. 2. The unit coils 122 are branched from a circumference of the center bushing 121, and are spirally wound on the circumference of the center bushing 121. Although the present invention uses 4 unit coils 122a, 122b, 122c, and 122d to be "4" for the purpose of illustration, it should be noted that the number of unit coils can also be determined to be other numbers if needed. In other words, the unit coils are arranged to have a predetermined turning number "n" calculated using a predetermined value of n=a×(b/m) (where "a" and "b" are both positive integers, and "m" is indicative of the number of unit coils corresponding to an integer greater than "2"). It is preferable that the center bushing 121 is formed of the same material as the unit coils 122a, 122b, 122c, and 122d, but it can also be formed of other materials if needed. The unit coils 122, the center bushing 121, and the support rod 124 are formed of conductive materials, may be formed of the same conductive material, or may also be formed of different materials, respectively.

The edge bushing 123 is configured in the form of a cylindrical ring, as shown in FIG. 3. The edge bushing 123 is formed of a ceramic or polymer-based material. As can be seen from the dotted lines in FIG. 1, the edge bushing 123 overlaps with the edge of the wafer 140. A plasma density measured at the edge of the wafer 140 is reduced by the edge bushing 123, such that a CD measured at the edge of the wafer 140 can be almost equal to the other CD measured at the center part of the wafer 140.

Figure 4:
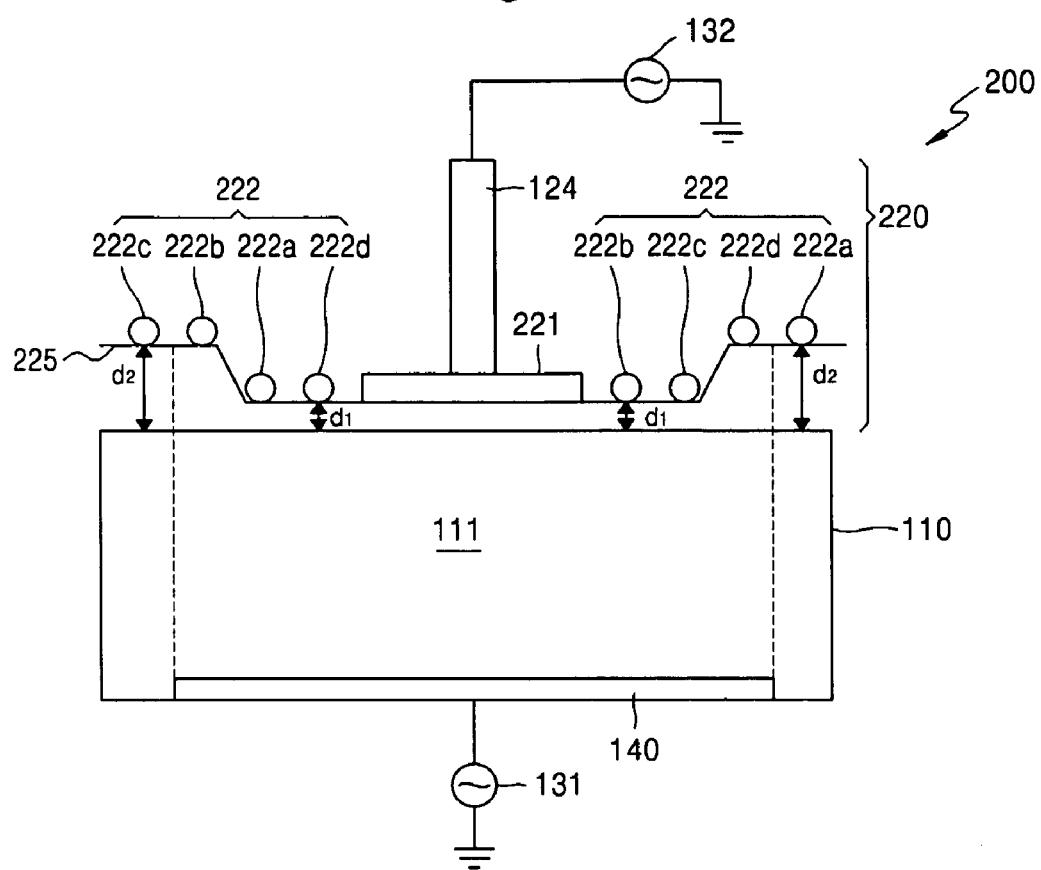
FIG. 4 is a cross-sectional view illustrating a plasma chamber including a plasma source coil in accordance with another preferred embodiment of the present invention.

FIG. 4 is a cross-sectional view illustrating a plasma chamber including a plasma source coil in accordance with another preferred embodiment of the present invention. Compared with FIG. 1, the same elements are denoted by the same reference numerals, such that their detailed description will herein be omitted for the convenience of description.

In accordance with another preferred embodiment of the present invention as shown in FIG. 4, a plasma source coil 220 for use in the plasma chamber 200 is different from the plasma source coil 120 for use in the plasma chamber 100. In other words, a plurality of unit coils 222a, 222b, 222c, and 222d for use in the plasma source coil 220 are branched from the circumference of the center bushing 221, and are spirally wound on the circumference of the center bushing 221 in the same manner as in FIG. 1. However, the unit coils 222a, 222b, 222c, and 222d are spaced apart from a dome of the chamber body 110 by different distances. In more detail, as for the portion overlapping the center part of the wafer 140, spacing between the unit coils 222a, 222b, 222c, and 222d and the dome of the chamber body 110 is set to a relatively low value, i.e., a first distance "d1". As for the portion overlapping the edge of the wafer 140, spacing between the unit coils 222a, 222b, 222c, and 222d and the dome of the chamber body is set to a relatively high value, i.e., a second distance "d2". The support 225 for supporting the above-mentioned unit coils 222a, 222b, 222c, and 222d includes a center part spaced apart from the dome of the chamber body 110 by the first distance "d1", an edge part spaced apart from the dome of the chamber body 110 by the second distance "d2", and another center part gradually spaced apart from the dome of the chamber body 110 by a predetermined distance from the first distance "d1" to the second distance "d2". A distance between the dome of the chamber body 110 and the unit coils 222a, 222b, 222c, and 222d at the edge of the wafer 140 is higher than the other distance between the dome of the chamber body 110 and the unit coils 222a, 222b, 222c, and 222d at the center part of the wafer 140. The plasma density measured at the edge of the wafer 140 is relatively less than that measured at the center part of the wafer 140, such that a CD measured at the edge of the wafer 140 can be almost equal to the other CD measured at the center part of the wafer 140.

Figure 5:
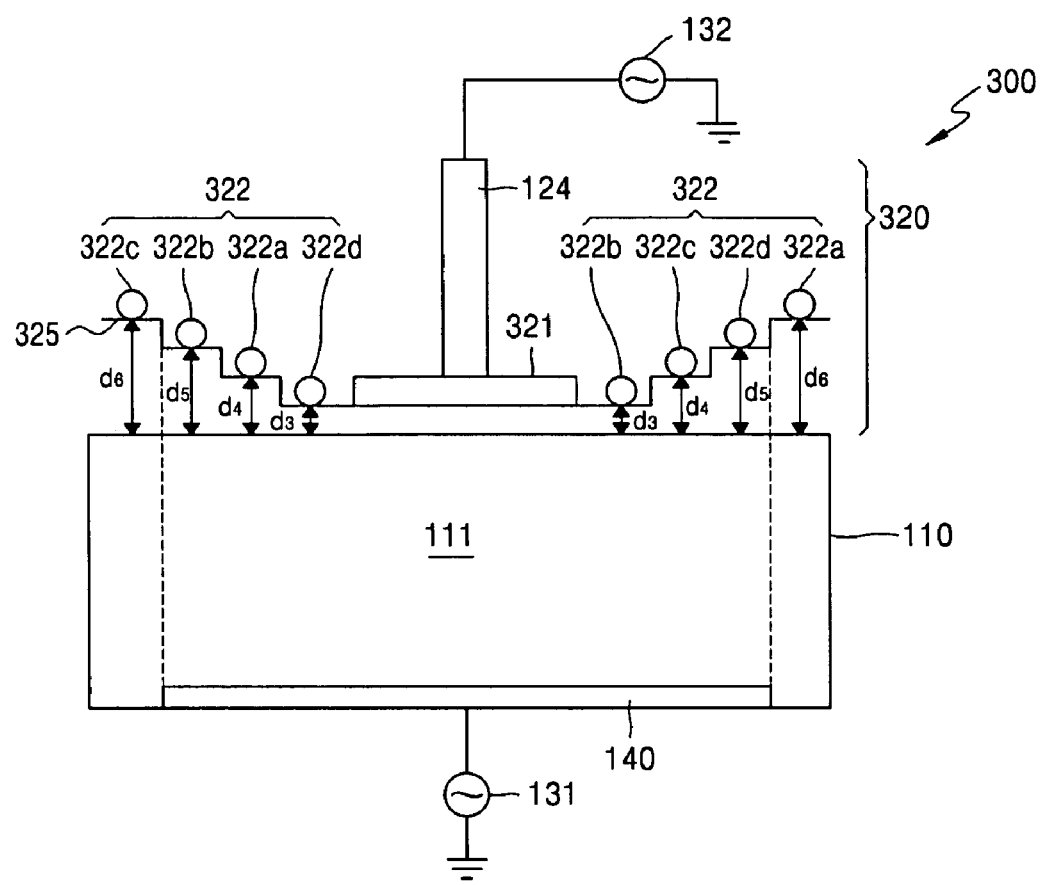
FIG. 5 is a cross-sectional view illustrating a plasma chamber including a plasma source coil in accordance with yet another preferred embodiment of the present invention.

FIG. 5 is a cross-sectional view illustrating a plasma chamber including a plasma source coil in accordance with yet another preferred embodiment of the present invention. Compared with FIG. 1, the same elements are denoted by the same reference numerals, such that their detailed description will herein be omitted for the convenience of description.

Referring to FIG. 5, a plasma source coil 320 for use in a plasma chamber 300 according to yet another preferred embodiment of the present invention is arranged stepwise. In more detail, the unit coils 322a, 322b, 322c, and 322d are spaced apart from the dome of the chamber body 110 by different distances. Particularly, as the unit coils 322a, 322b, 322c, and 322d are arranged in a direction from the center part of the wafer 140 to the edge, the unit coils 322a, 322b, 322c, and 322d are sequentially spaced apart from the dome of the chamber body 110 by longer distances. The unit coil closest to the center part of the wafer 140, i.e., a first unit coil closest to the center bushing 321, is spaced apart from the dome of the chamber body 110 by a first distance "d3". A second unit coil next to the above-mentioned first unit coil in the direction of the edge of the wafer 140 is spaced apart from the dome of the chamber body 110 by a second distance "d4". The second distance "d4" is longer than the first distance "d3". A third unit coil next to the second unit coil in the direction of the edge of the wafer 140 is spaced apart from the dome of the chamber body 110 by a third distance "d5". In this case, the third distance "d5" is longer than the second distance "d4". A fourth unit coil next to the third unit coil in the direction of the edge of the wafer 140, i.e., the outermost unit coil, is spaced apart from the dome of the chamber body 110 by a fourth distance "d6". In this case, the fourth distance "d6" is longer than the third distance "d5". In this way, as the unit coils 322a, 322b, 322c, and 322d are arranged in a direction from the center part of the wafer 140 to the edge of the wafer 140, they are arranged in the form of steps. In this manner, the closer the edge of the wafer 140, the longer the distance from the dome of the chamber body 110. Therefore, a plasma density measured at the edge of the wafer 140 is gradually reduced, and a CD measured at the edge of the wafer 140 is also reduced, such that the CD measured at the edge of the wafer 140 can be balanced with the center part of the wafer 140.

Figure 6:
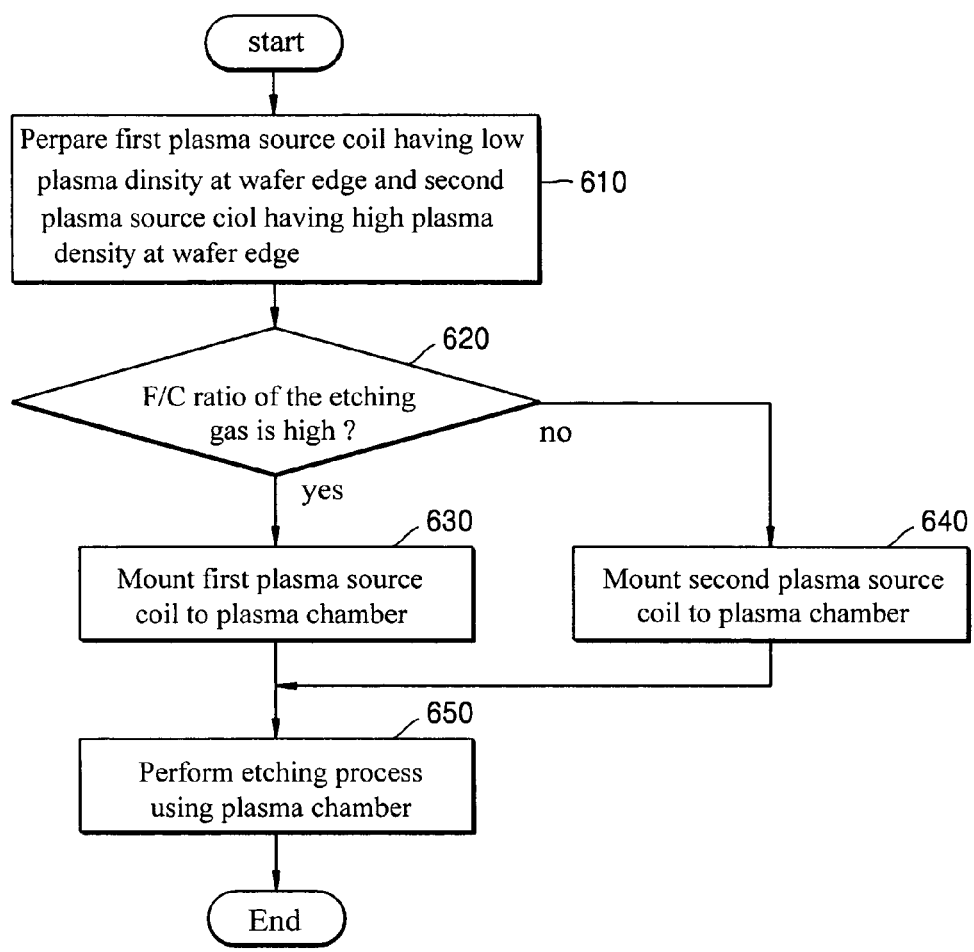
FIG. 6 is a flow chart illustrating a wafer etching method using a plasma chamber in accordance with the present invention.
Figure 7:
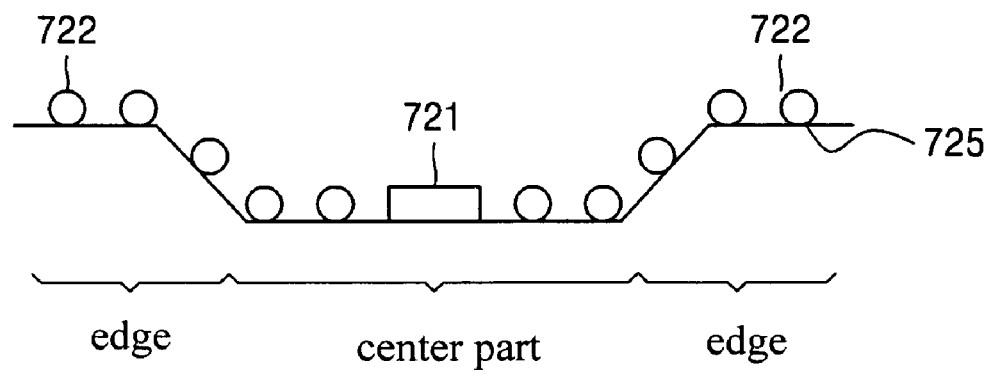
FIG. 7 shows the appearance of a first plasma source coil of FIG. 6 in accordance with the present invention.
Figure 8:
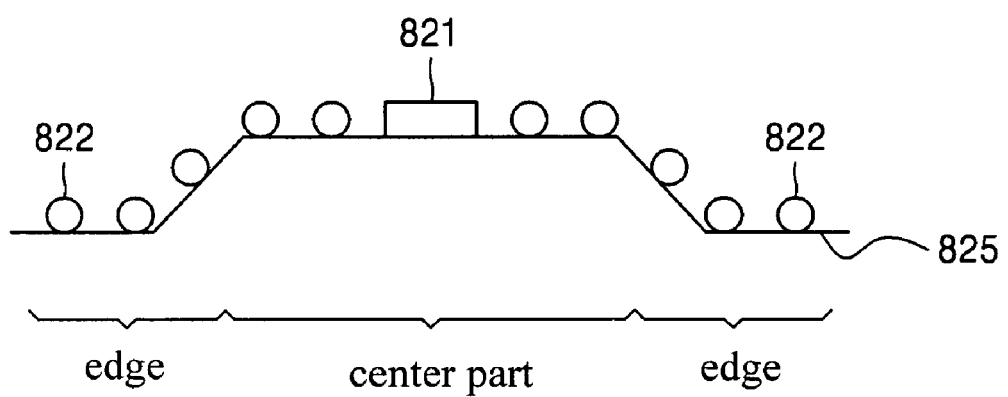
FIG. 8 shows the appearance of a second plasma source coil of FIG. 6 in accordance with the present invention.
Figure 6:
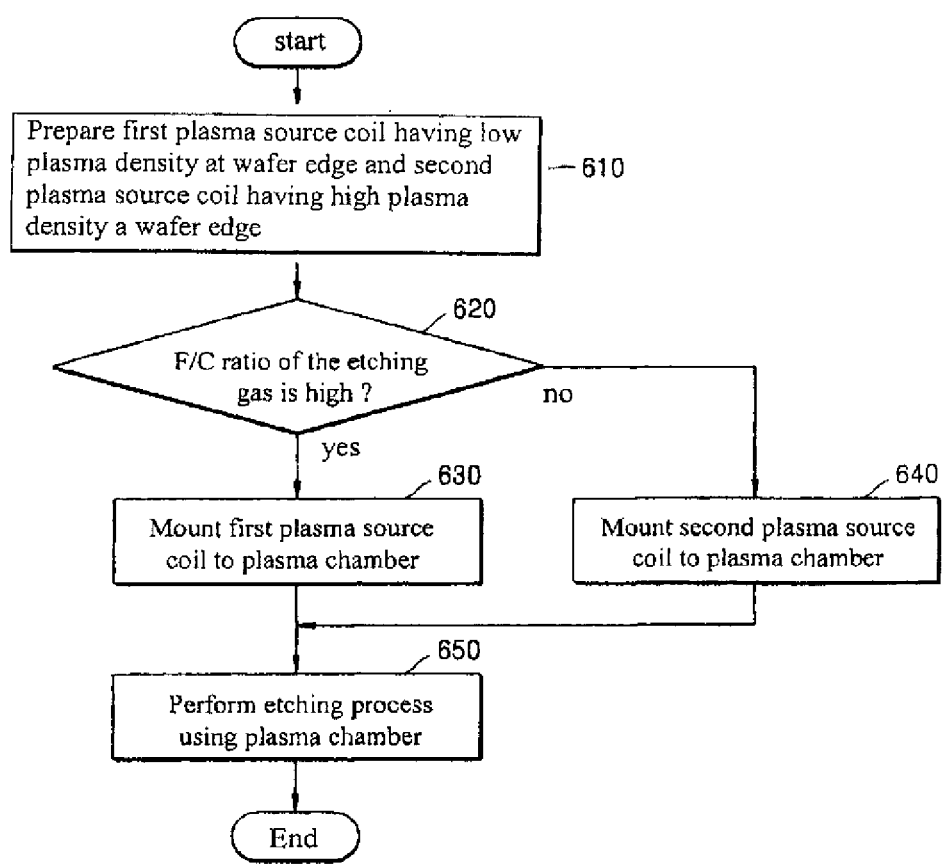

FIG. 6 is a flow chart illustrating a wafer etching method using a plasma chamber in accordance with the present invention. FIG. 7 shows the appearance of a first plasma source coil of FIG. 6. FIG. 8 shows the appearance of a second plasma source coil of FIG. 6.

Referring to FIGS. 6-8, not only a first plasma source coil in which a plasma density at the edge of the wafer is less than the other plasma density at the center part of the wafer, but also a second plasma source coil in which a plasma density at the edge of the wafer is higher than the other plasma density at the center part of the wafer is prepared at step 610. As shown in FIG. 7, the first plasma source coil has the structure of concave-type, such that the center part of a wafer is more concave than the edge. Therefore, a plurality of unit coils 722, which are supported by the support 725, are branched from the bushing 721, and spirally surround the circumference of the bushing 721, are arranged to be closer to the chamber body at the center part of the wafer, and are arranged to be far from the chamber body at the edge of the wafer. In this case, although the chamber body is not shown in the drawings, it should be noted that the chamber body is arranged at the lower part of the plasma source coil. Referring to FIG. 8, the second plasma source coil has the structure of convex-type, such that the center part of the wafer is more convex than the edge. Therefore, a plurality of unit coils 822, which are supported by the support 825, are branched from the bushing 821, and spirally surround the circumference of the bushing 821, are arranged to be far from the chamber body at the center part of the wafer, and are arranged to be closer to the chamber body at the edge of the wafer.

It is determined whether the ratio of fluorine (F) to carbon (c), i.e., an F/C ratio, is high or low at step 620. In this case, if the etching gas has a high F/C ratio, the etching gas is capable of generating less polymers acting as by-products. For example, the above-mentioned etching gas is indicative of $CF_4$, $C_2F_6$, $C_3F_8$, or $CHF_3$, etc. In this case, the etching gas, such as $CF_4$, $C_2F_6$, $C_3F_8$, or $CHF_3$, generally has an F/C ratio greater than "2". On the contrary, if the etching gas has a low F/C ratio, the etching gas is capable of generating more polymers acting as by-products. For example, the above-mentioned etching gas is indicative of $C_4F_8$, $C_5F_8$, $CH_3F$, $CH_2F_2$, or $C_4F_6$, etc, and generally has an F/C ratio less than "2".

If the F/C ratio of the etching gas is high, the first plasma source coil is mounted to the plasma chamber at step 630. If the F/C ratio of the etching gas is high, less polymers are generated, such that over etching occurs at the edge of the wafer, resulting in increased CD. In order to prevent the above-mentioned problem from occurring, the plasma density at the edge of the wafer must be reduced, such that the first plasma source coil having a low plasma density at the edge of the wafer is mounted to the plasma chamber. Thereafter, the etching process using the plasma chamber including the first plasma source coil is performed at step 650.

In the meantime, if the F/C ratio of the etching gas is high, the second plasma source coil is mounted to the plasma chamber at step 640. If the F/C ratio of the etching gas is low, more polymers are generated. Therefore, over etching occurs at the edge of the wafer, resulting in the occurrence of a CD. In order to prevent the CD from occurring, the plasma density must be increased at the edge of the wafer such that a large amount of polymers are generated at the edge of the wafer. Therefore, the second plasma source coil having a high plasma density at the edge of the wafer is mounted to the plasma chamber. Thereafter, the etching process using the plasma chamber including the second plasma source coil is performed at step 650.

INDUSTRIAL APPLICABILITY

As apparent from the above description, the present invention is applicable to not only a semiconductor using a plasma chamber for use with plasma, but also a variety of devices and processes in a similar way to a technical field of the semiconductor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A plasma chamber comprising:

a chamber body for defining a reaction space, capable of forming plasma, by a sidewall of the chamber body, a lower exterior wall of the chamber body, and an upper dome of the chamber body;

a plasma source coil arranged on the dome, for including unit coils arranged to have a turning number "n" calculated using a value of n=a×(b/m) (where "a" and "b" are both positive integers, and "m" is indicative of the number of unit coils corresponding to an integer greater than "2"), allowing the unit coils to be extended from a center bushing which has a radius at a center part, and allowing the unit coils to be spirally arranged along a circumference of the center bushing, such that the plasma is formed in the reaction space; and a cylindrical-shaped edge bushing arranged between the dome of the chamber body and the plasma source coil, and for overlapping with an edge of a wafer disposed in the reaction space.

2. The plasma chamber according to claim 1, wherein the edge bushing is formed of a ceramic or polymer-based material.

3. A plasma chamber comprising:

a chamber body for limiting a size of a reaction space, capable of forming plasma, by a sidewall of the chamber body, a lower exterior wall of the chamber body, and an upper dome of the chamber body; and a plasma source coil arranged on the dome, for allowing a plurality of unit coils, having a turning number, to be extended from a center bushing which has a radius at a center part, and allowing the unit coils to be spirally arranged along a circumference of the center bushing, in which, as the unit coils are arranged in a direction from a center part of a wafer to an edge of the wafer, a distance from the dome is gradually increased, such that the unit coils are arranged stepwise and the plasma is formed in the reaction space.

4. The plasma chamber according to claim 3, wherein the unit coils are arranged to have the turning number "n" calculated using a value of n=a×(b/m) (where "a" and "b" are both positive integers, and "m" is indicative of the number of unit coils corresponding to an integer greater than "2").

* * * * *

UNITED STATES PATENT AND TRADEMARK OFFICE
CERTIFICATE OF CORRECTION

Page 1 of 2

PATENT NO.      : 7,524,395 B2
APPLICATION NO. : 10/593857
DATED           : April 28, 2009
INVENTOR(S)     : Nam Hun Kim It is certified that error appears in the above-identified patent and that said Letters Patent is hereby corrected as shown below:

On the Title Page
Item (57) Abstract, line 12        Before "arranged" insert -- is --

In the Drawings
Fig. 6, Sheet 5 of 6               Delete Drawing Sheet 5 and substitute therefore the Drawing Sheet, consisting of Fig. 6, as shown on the attached page Signed and Sealed this
Twenty-eighth Day of February, 2012

David J. Kappos
*Director of the United States Patent and Trademark Office*